(12) United States Patent
Maeda

(10) Patent No.: US 8,248,104 B2
(45) Date of Patent: Aug. 21, 2012

(54) PHASE COMPARATOR AND PHASE-LOCKED LOOP

(75) Inventor: Tadashi Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 9 days.

(21) Appl. No.: 12/676,221

(22) PCT Filed: Sep. 2, 2008

(86) PCT No.: PCT/JP2008/065754
§ 371 (c)(1),
(2), (4) Date: Mar. 3, 2010

(87) PCT Pub. No.: WO2009/034881
PCT Pub. Date: Mar. 19, 2009

(65) Prior Publication Data
US 2010/0171527 A1    Jul. 8, 2010

(30) Foreign Application Priority Data
Sep. 14, 2007    (JP) .................... 2007-238621

(51) Int. Cl.
*G01R 25/00* (2006.01)
*H03D 13/00* (2006.01)
(52) U.S. Cl. .............. 327/7; 327/2; 327/12; 327/115; 327/117
(58) Field of Classification Search ............. 327/2, 7, 327/12, 115, 117
See application file for complete search history.

(56) References Cited

U.S. PATENT DOCUMENTS

| 6,034,554 A * | 3/2000 | Francis et al. ............ 327/7 |
| 6,580,376 B2 * | 6/2003 | Perrott ................... 341/61 |
| 2002/0033737 A1 * | 3/2002 | Staszewski et al. ......... 331/17 |

FOREIGN PATENT DOCUMENTS

| JP | 5-122064 A | 5/1993 |
| JP | 8-65287 A | 3/1996 |
| JP | 8-213900 A | 8/1996 |
| JP | 2002076886 A | 3/2002 |
| JP | 2002135093 A | 5/2002 |
| JP | 2002158568 A | 5/2002 |
| JP | 2003179489 A | 6/2003 |
| JP | 2004180125 A | 6/2004 |
| JP | 2005020221 | 1/2005 |
| JP | 2007110370 A | 4/2007 |

OTHER PUBLICATIONS

R. B. Staszewski et al., "All-Digital TX Frequency Synthesizer and Discrete-Time Receiver for Bluetooth Radio in 130-nm CMOS", IEEE Journal of Solid-State Circuits, vol. 39, No. 12, Dec. 2004, pp. 2278-2291.
International Search Report for PCT/JP2008/065754, Oct. 14, 2008, NEC Corporation.

* cited by examiner

*Primary Examiner* — John Poos

(57) ABSTRACT

A phase comparator is provided that solves the problem that a VCO cannot be controlled with high precision. A frequency divider frequency-divides a VCO signal applied as input to an input terminal (10) in steps, and supplies the VCO signals of each step as output. A latch unit latches the VCO signal that is applied to the input terminal (10) and each VCO signal that was supplied from the frequency divider based on a reference signal that is applied to an input terminal (11). An output unit supplies the latch results realized by the latch unit as phase difference signals that indicate phase differences of the reference signal and the VCO signals.

13 Claims, 13 Drawing Sheets

PHASE COMPARATOR AND PHASE-LOCKED LOOP

TECHNICAL FIELD

The present invention relates to a phase comparator and phase-locked loop (PLL), and more particularly, relates to a phase comparator for detecting the phase difference between an oscillation clock of a voltage-controlled oscillator and a reference clock as a digital signal, and to a phase-locked loop that includes a voltage-controlled oscillator that is digitally controlled by the output of the phase comparator.

BACKGROUND ART

In a high-speed wireless communication system such as WLAN (wireless local area network) of IEEE 802.11a/g, a higher order modulation such as 16 QAM or 64 QAM is adopted for transmitting a large-volume signal efficiently within a limited frequency band. A chip for wireless applications that is used in this type of high-speed wireless communication system requires high power for signal processing. As a result, little progress has been seen in the application of the chips for wireless applications to terminals such as cellular phones with the exception of the comparatively slow IEEE 802.11b.

In recent years, the application of deep-submicron-CMOS devices to basebands with the aim of implementing signal processing with low power consumption has been advancing. As a result, the power-supply voltage of the baseband is lower.

In addition, there is a trend in chips for wireless applications to integrate a digital unit and RF unit to reduce costs. A chip in which a digital unit and RF unit are integrated is referred to as a "system-on-chip" (Soc).

In a System-on-chip, the RF unit must be produced by a micro-device and an RF circuit that operates at low voltage is therefore required. However, in conventional RF circuits that chiefly use the analog mode, element characteristics change when subjected to miniaturization and operation at low voltage is therefore problematic. In particular, a PLL is greatly affected by lower voltage in the RF circuit.

FIG. 1 is a block diagram showing an example of a PLL circuit of the analog type. In FIG. 1, the PLL circuit includes: phase comparator 1, charge pump 2, loop filter 3', voltage-controlled oscillator (VCO) 4, and frequency divider 5.

Regarding the operation of this circuit, phase comparator 1 compares a reference signal (FREF signal) and the frequency-divided signal (CKV signal) of VCO 4, and based on the comparison result, generates output signals S1 and S2. Output signal S1 shows the amount of advance of the phase of the FREF signal with respect to the CKV signal, and output signal S2 shows the amount of advance of phase of the CKV signal with respect to the FREF signal.

Output signals S1 and S2 are applied as input to charge pump 2. The output signal S3 of charge pump 2 is applied as input to loop filter 3'. Loop filter 3' eliminates the high-frequency component of output signal S3 and applies output signal S3 from which this high-frequency component has been eliminated to VCO 4 as control voltage S4.

When the frequency and phase of FREF signal and CKV signal match, this PLL circuit locks the frequency (fVCO) that VCO 4 supplies and sets this fVCO to several times the frequency-division of the frequency of the FREF signal.

For example, when VCO 4 is of the type that uses an inductor and the resonance frequency of a MOS varactor capacitance, fVCO changes according to the control voltage of the MOS varactor, which is a direct-current voltage. Increase to a high level in the modulation sensitivity, which is the amount of change of fVCO with respect to this change in the control voltage, gives rise to the problem in which that fVCO fluctuates due to the effect of power-supply noise or induction noise.

To solve this problem, a method has been proposed of setting the modulation sensitivity to a low level and using a plurality of resonance circuits. However, the range of the control voltage of a MOS varactor is limited to the linear region of the MOS varactor, and the problem therefore arises that lowering the power-supply voltage necessitates increasing the modulation sensitivity of the VCO, whereby the frequency of a local oscillator fluctuates due to noise outside and inside the chip.

As a means of solving this problem, a circuit for digitally controlling the VCO has been proposed (for example, refer to Document 1 (JP-A-2002-076886) and Document 2 (Journal of Solid-State Circuit, Vol. 39, No. 1/2, 2004, pp. 2278-2291).

In the related art, a time-control method is used in which a MOS varactor in a VCO is controlled not by the level of a direct-current voltage that is the control voltage, but by the ON/OFF time ratio realized by repeatedly turning the control voltage ON and OFF. When carried out with the control voltage turned ON/OFF at a fixed period, a large spurious signal is generated. As a result, a sigma-delta ($\Sigma\Delta$) modulator is used in the art of the above-described documents to randomize the ON/OFF periods of the control voltage.

The operation of the PLL circuit used in the time-control method is described using FIG. 2.

The output signal of a digitally controlled VCO (dVCO) that oscillates at 2.4 GHz in numerically-controlled oscillator (NCO) 103 is converted to CKV signal 114 in sine-wave digital converter 106. Incrementor (INC) 118 generates phase $\theta v(i)$ of the output signal of a digitally-controlled VCO by accumulating the number of clock transitions of the rising edge of CKV signal 114.

FREF signal 110, which is the output signal of a reference quartz oscillator, is retimed by CKV signal 114 and converted to CKR signal 112. Accumulator 102 generates the phase $\theta r(k)$ of FREF signal 110 by accumulating frequency control (FCW) 116 that indicates a multiple of the target frequency for each rising edge of CKR signal 112.

Circuit 108 rounds off the decimal part of phase $\theta r(k)$ of FREF signal 110. In addition, latch register 120 latches phase v(i) that was generated by incrementor 118 at the timing of CKR signal 112 to generate phase $\theta r(k)$. Combining element $\frac{1}{22}$ subtracts phase $\theta v(k)$ generated at latch register ½ from phase $\theta r(k)$ that was rounded off in circuit 108 to generate phase error signal $\theta d(k)$.

Phase error signal $\theta d(k)$, after being multiplied with a predetermined gain in gain element 105 in numerically-controlled oscillator 103, is applied as a signal for tuning to digitally controlled VCO (dVCO) 104.

A phase detection method that uses the accumulation of the number of clock transitions of the rising edge of this CKV signal is incapable of a realizing resolution that is equal to or less than the oscillation period of the VCO. As a result, in Documents 1 and 2, fractional phase detector 200 is further provided and time-digital converter (TDC) 201 in fractional phase detector 200 is used to detect micro-phase error.

As shown in FIGS. 3 and 4, in time-digital converter (TDC) 201, the position of a transition from "1" to "0" of CKV signal 114 is indicated by the delay time $\Delta tr$ that is quantized from the edge that samples CKV signal 114 of FREF signal 110 of rising edge 302 of CKV signal 114. In addition, the position of the transition from "0" to "1" of CKV signal 114 is indicated by delay time Δtr that is quantized from the edge that samples CKV signal 114 of FREF signal 110 of falling edge 302 of CKV signal 114. In addition, delay times Δtr and Δtr are represented using a multiple of the time resolution Δtres.

Here, small phase error φF is given by −Δtr/2(Δtf−Δtr) when Δtf>Δtr, and is given by 1−Δtr/2(Δtr−Δtf) when Δtr>Δtf.

FIG. 5 is a circuit diagram that shows an example of time-digital converter 201 for detecting the phase error equal to or less than the period of CKV signal shown in FIG. 2. In FIG. 5, time-digital converter 500 is made up from: a plurality of delay elements 502, a plurality of latch/registers 504. Delay elements 502 are made up from inverters.

CKV signal 114 that is generated at dVCO is successively delayed at the plurality of delay elements 502. Each of delayed CKV signals 114 are latched by respective latch/register 504 at the rising edge of FREF signal 110. The total of the delay time realized by the plurality of delay elements 502 can adequately cover the clock periods of CKV signals 114, and the phase error can be detected by resolution Δtres that is determined by the delay time of the delay elements.

FIG. 6 shows timing chart 600 for explaining the operation of the circuit shown in FIG. 5. Each of the plurality of latch/registers 504 latches a respective delayed CKV signal 114 at the timing of the rising edge of FREF signal 110. In this way, instantaneous value 604 that indicates the size of the delay of CKV signal is obtained from rising edge 602 of FREF signal 110. This instantaneous value 604 can be considered a value that indicates the phase difference of FREF signal 110 and CKV signal by a digital value.

A PLL circuit precisely controls the frequency of dVCO 104 by using a digital value to control a ΣΔ-modulator.

This digital control of a VCO enables the generation of a stable and precise oscillation signal even in low-voltage operation of a deep-submicron-CMOS device.

DISCLOSURE OF THE INVENTION

Problem to be Solved by the Invention

However, it is anticipated that an increase in the oscillation frequency of a VCO calls for improvement of the resolution of the phase comparator.

The phase comparator of the above-described related art cannot realize resolution that is less than the delay time of the inverters, raising the problem in which the VCO cannot be controlled with high precision. Even if the resolution is improved, fluctuation in the delay time of each inverter (originating from variation within the chip) exerts a direct influence on the precision of the phase comparator, and the problem remains in which the VCO cannot be controlled with high precision.

It is an object of the present invention to provide a phase comparator and phase-locked loop that solves the above-described problem in which a VCO cannot be controlled with high precision.

Means for Solving the Problem

The phase comparator according to the present invention includes: a first input means to which an object signal is applied; a second input means to which a reference signal is applied; a frequency division means for frequency-dividing in steps the object signal that was received in the first input means and supplying the object signals of each step; a latch means for, based on the reference signal that was applied to the second input means, latching each of the object signal applied to the first input means and each of the object signals that are supplied from the frequency division means; and an output means for supplying latch results realized by the latch means as phase difference signals indicating the phase differences of the reference signal and the object signals.

The first phase-locked loop of the present invention includes the above-described phase comparator and an oscillator that is controlled by the phase difference signals supplied from the phase comparator.

In addition, the second phase-locked loop of the present invention includes: the above-described phase comparator; an oscillator for generating a plurality of frequency signals having mutual differences in phase according to the phase difference signals supplied from the phase comparator and for supplying the plurality of frequency signals; and a generator for generating the different phase signals based on the plurality of frequency signals supplied from the oscillator and applying the different phase signals as input to the phase comparator.

Effect of the Invention

According to the present invention, control of a VCO can be realized with high precision.

BEST MODE FOR CARRYING OUT THE INVENTION

Embodiments of the present invention are next described in detail with reference to the accompanying figures. In each of the figures, components having the same function are given the same reference numbers, and redundant explanation of functions is omitted.

First Embodiment

Figure 1:
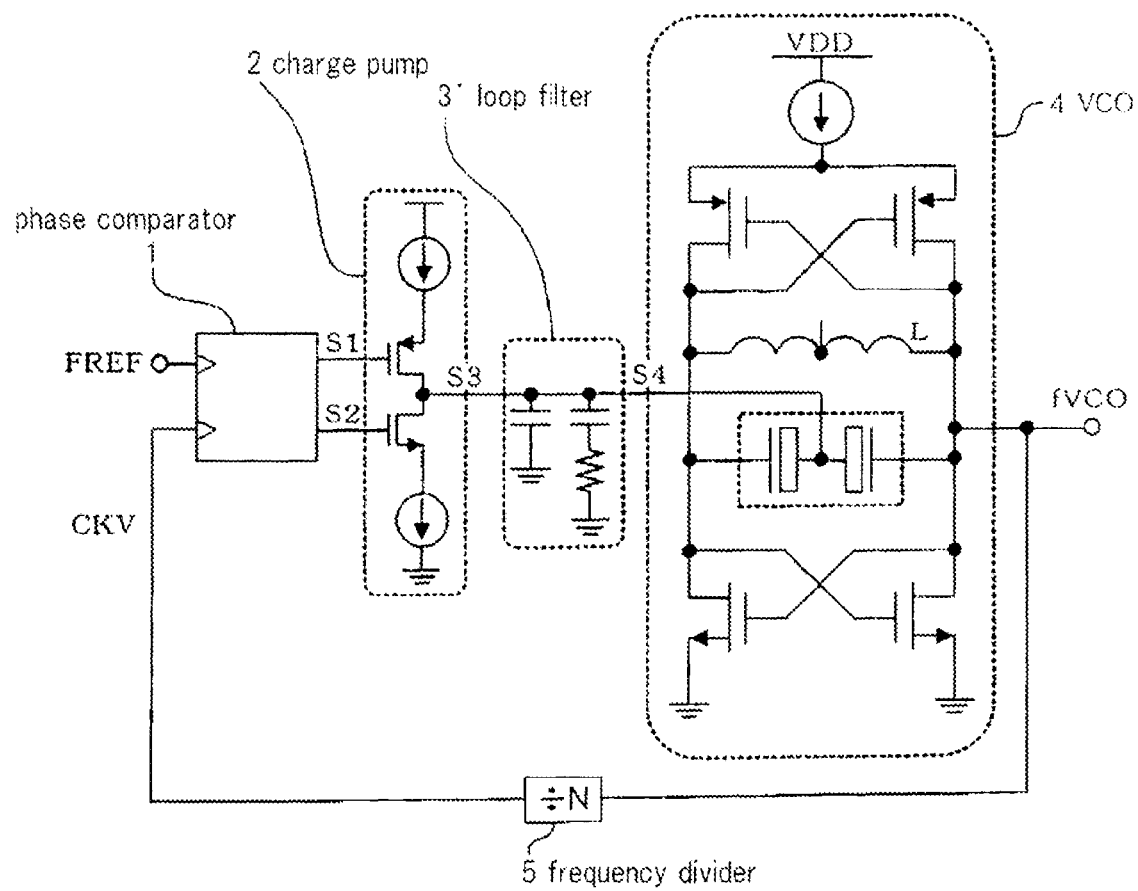
FIG. 1 is a block diagram showing an analog PLL circuit of the related art.
Figure 2:
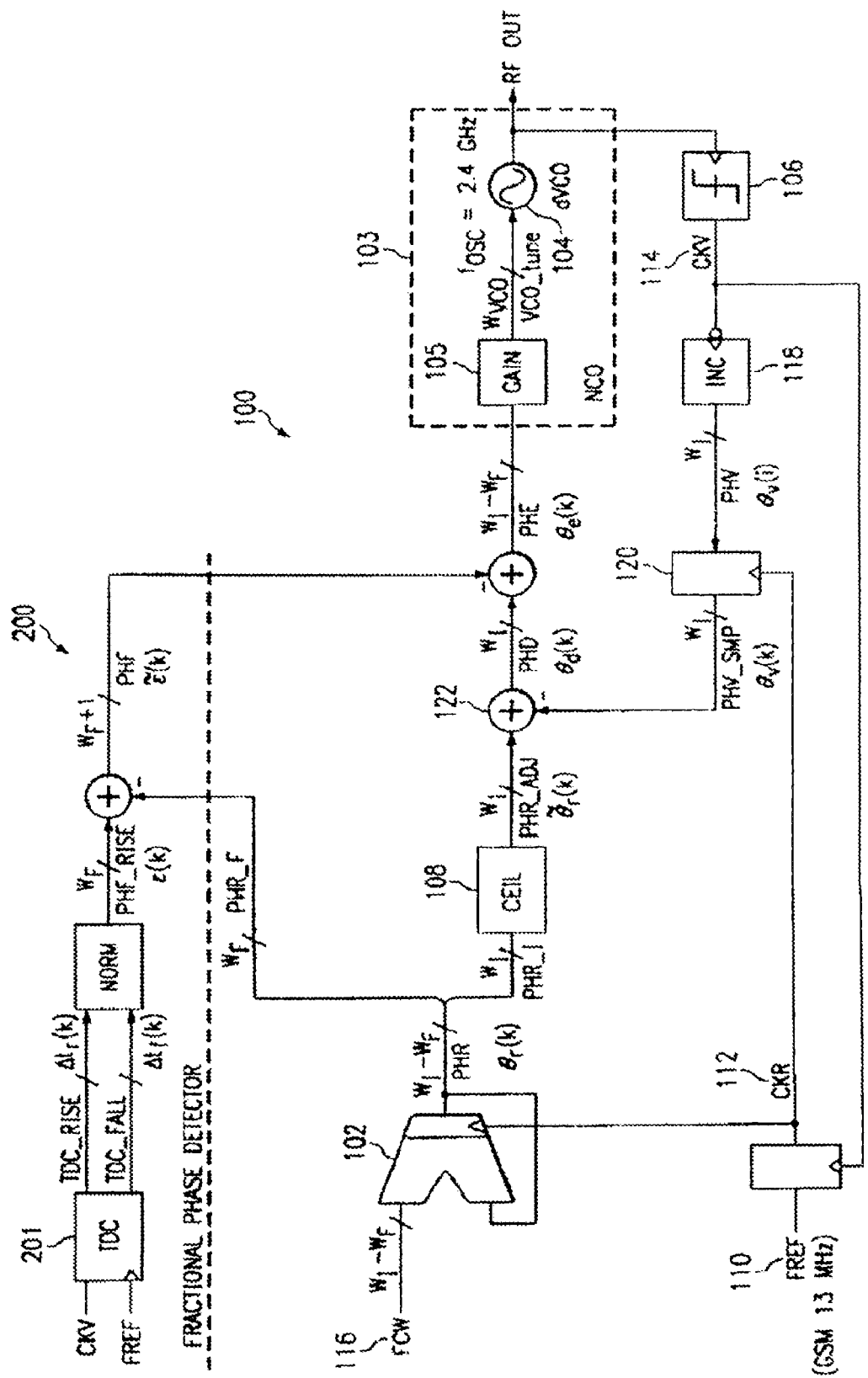
FIG. 2 is a block diagram showing a digital PLL circuit of the related art.
Figure 3:
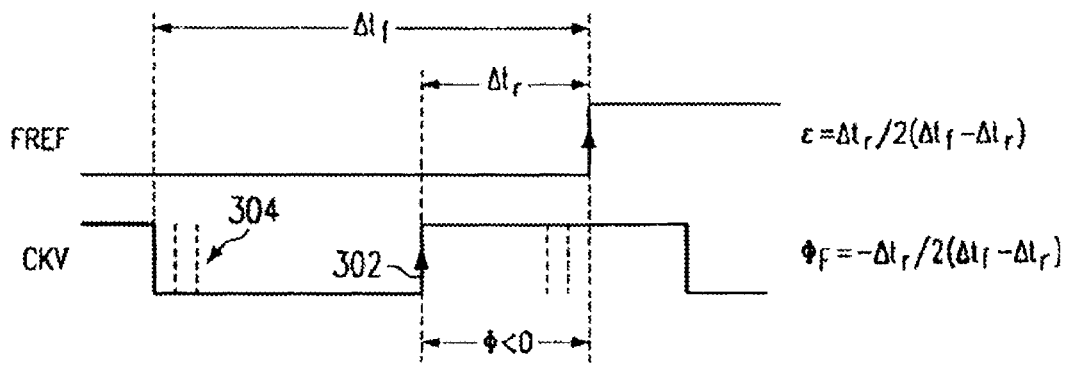
FIG. 3 is a timing chart (the first of 2) for explaining the principles of phase comparison in the PLL circuit shown in FIG. 2.
Figure 4:
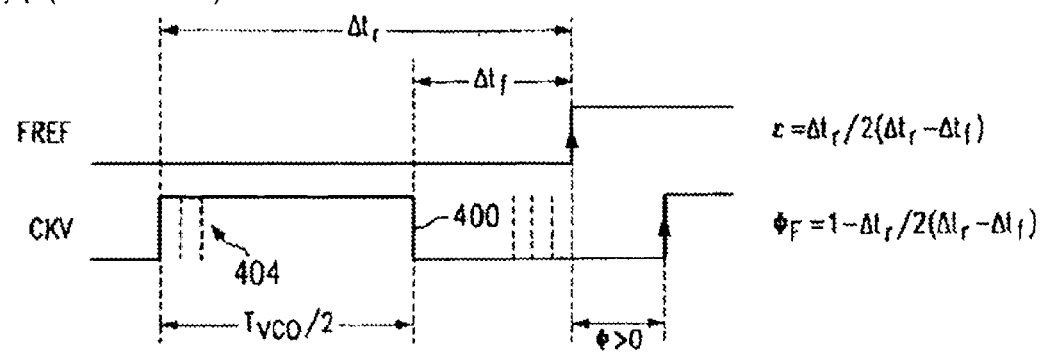
FIG. 4 is a timing chart (the second of 2) for explaining the principles of phase comparison in the PLL circuit shown in FIG. 2.
Figure 5:
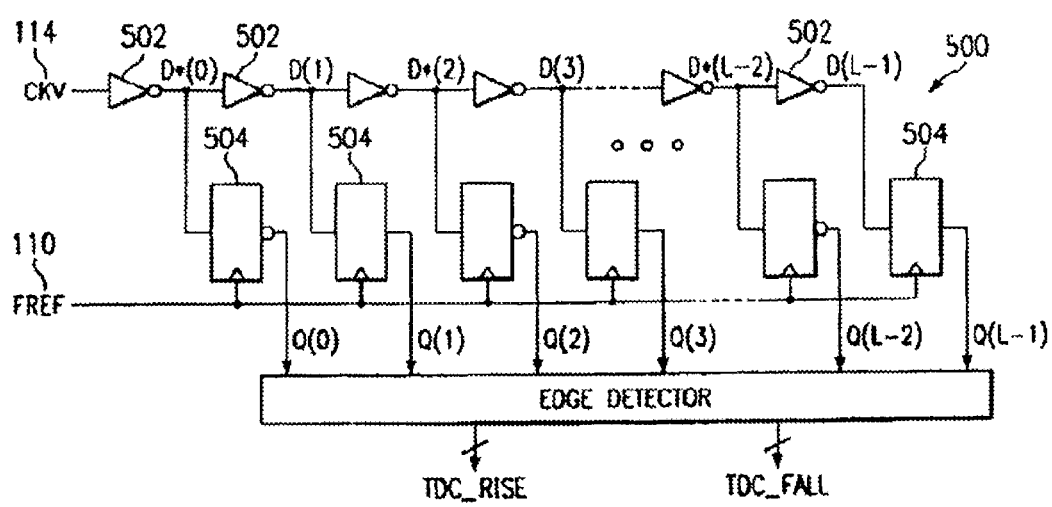
FIG. 5 is a block diagram showing the phase comparison circuit of decimal parts in the PLL circuit shown in FIG. 2.
Figure 6:
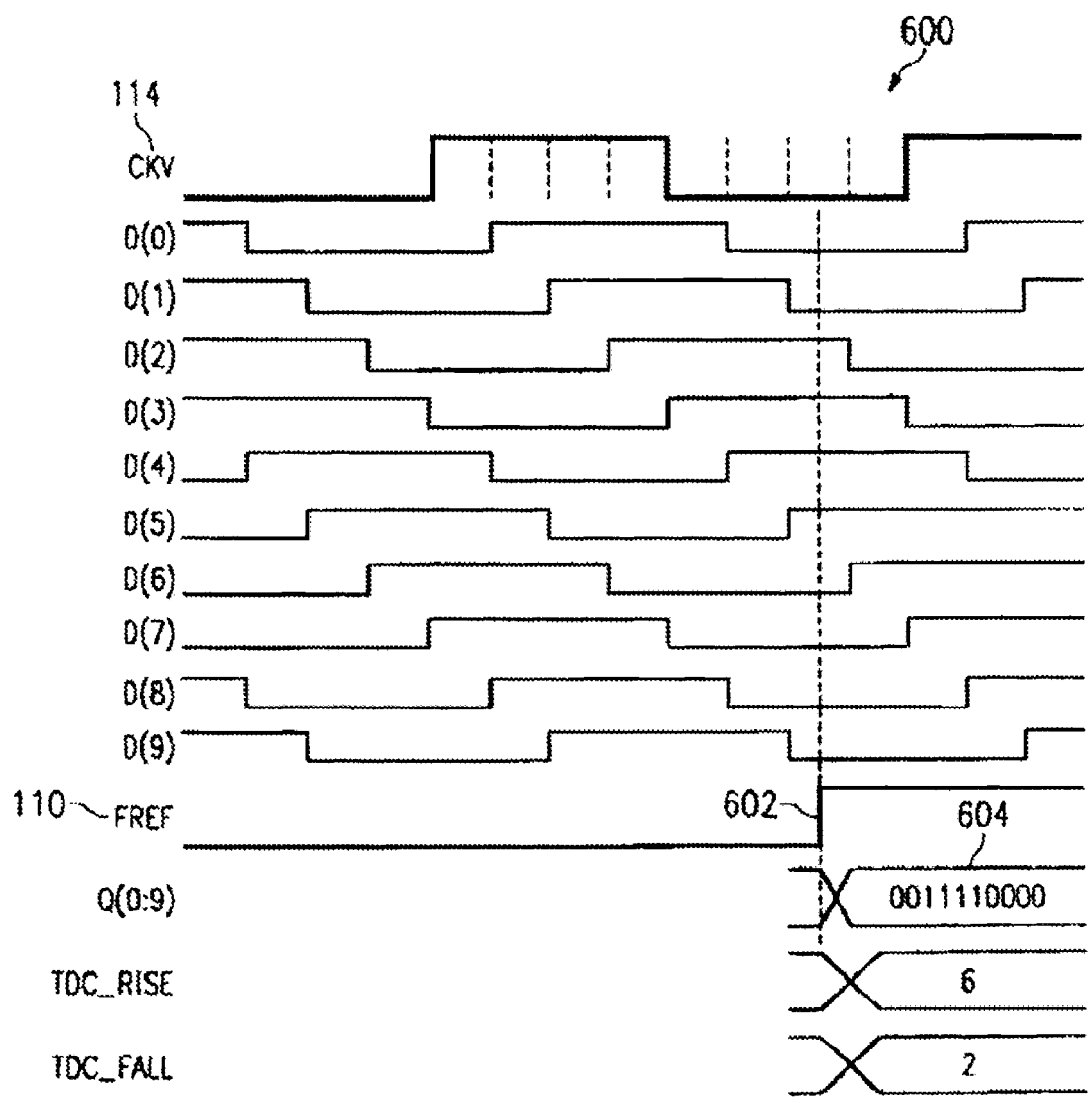
FIG. 6 is a timing chart for explaining the operation of phase comparison in the circuit shown in FIG. 5.
Figure 7:
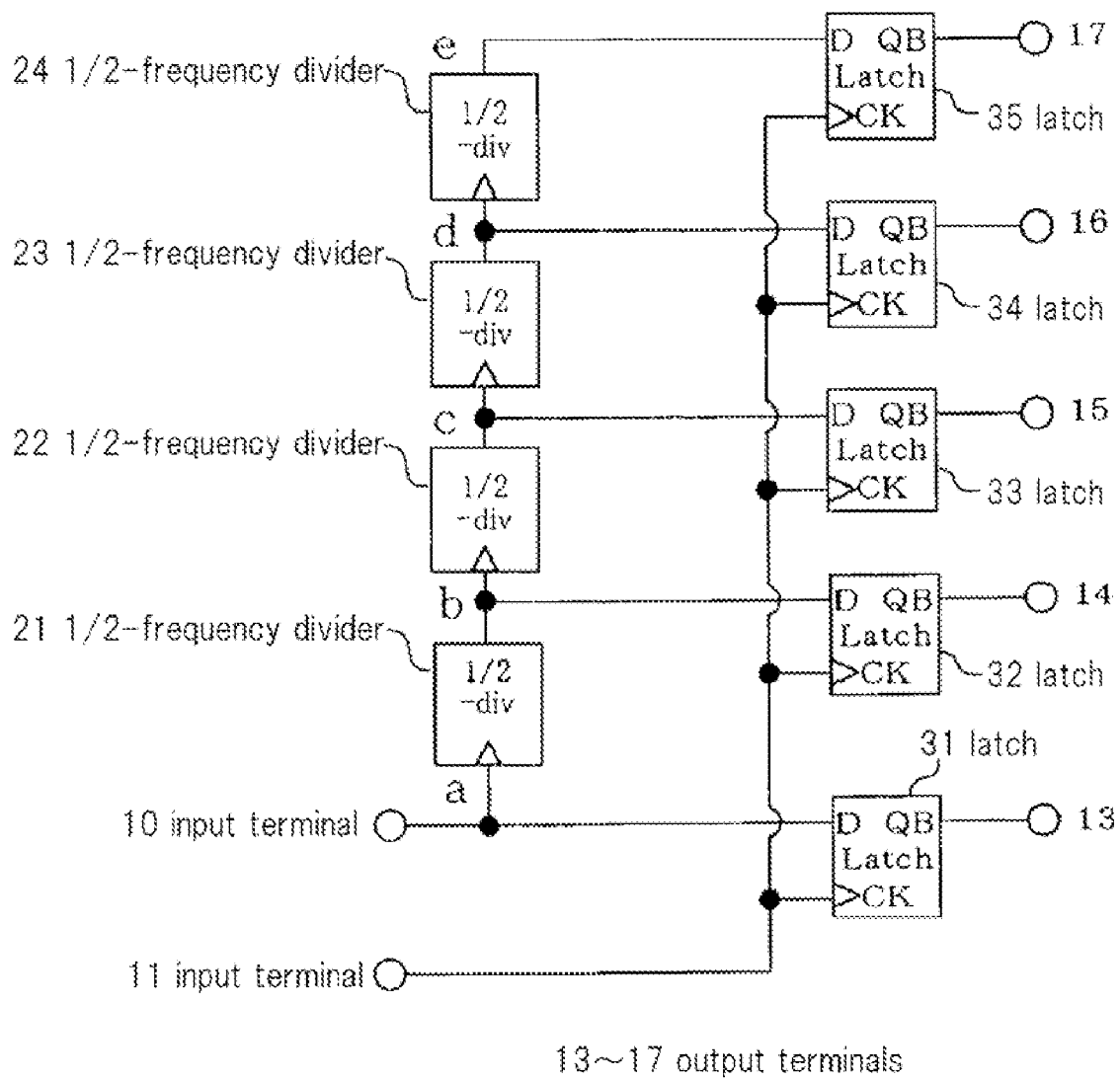
FIG. 7 is a block diagram showing the configuration of the phase comparison circuit of the first embodiment of the present invention.

FIG. 7 is a block diagram showing the configuration of the phase comparator of the first embodiment of the present invention. In FIG. 7, the phase comparator includes: input terminals 10 and 11, an output unit having output terminals 13-17, a frequency divider having ½-frequency dividers 21-24, and latch unit having latches 31-35.

Input terminal 10 is one example of the first input means. A VCO signal, which is the output signal of a VCO (voltage-controlled oscillator), is applied as input to input terminal 10. The VCO signal is one example of the object signal.

Input terminal 11 is one example of the second input means. A reference signal is applied as input to input terminal 11. In this case, the VCO signal is higher speed than the reference signal.

The frequency divider ½-frequency-divides the VCO signal that was applied to input terminal 10 in steps and supplies the VCO signal of each step.

½-frequency dividers 21-24 are connected together in a series. ½-frequency divider 21 ½-frequency-divides the VCO signal that was applied to input terminal 10. In addition, each of ½-frequency dividers further ½-frequency-divides the VCO signal that was ½-frequency divided in the ½-frequency divider of the previous stage. The output terminals of each of input terminal 10 and ½-frequency dividers 21-24 are hereinbelow referred to as points a-e.

As a result, the VCO signal (½-frequency divided signal) that was ½-frequency-divided is supplied from ½-frequency divider 21 (point b). VCO signal (¼-frequency-divided signal) that was ¼-frequency-divided is supplied from ½-frequency divider 22 (point c). VCO signal (⅛-frequency-divided signal) that was ⅛-frequency-divided is supplied from ½-frequency divider 23 (point d). VCO signal (1/16-frequency-divided signal) that was 1/16-frequency-divided is supplied from ½-frequency divider 24 (point e). The ½-frequency-divided signal to the ⅙-frequency-divided signal may be referred to as frequency-divided signals.

The latch unit performs latching of the VCO signal that is applied as input to input terminal 10 and each of the frequency-divided signals supplied from ½-frequency dividers 21-24 based on the reference signal applied as input to input terminal 11.

More specifically, each of latches 31-35 uses the reference signal as a clock signal. Each of latches 31-35 latches the VCO signal applied to input terminal 10 and a frequency-divided signal supplied from a respective one of ½-frequency dividers 21-24 at the timing of the rising edge of the clock signal. Each of latches 31-35 further applies the result of latching of its own latch to a respective output terminal of output terminals 13-17.

The output unit supplies each VCO signal received from the latch unit as a phase difference signal that indicates the phase difference between the reference signal and the VCO signal.

The resolution of the phase difference that can be detected at the phase comparator of the present embodiment is one-half of the period of the VCO signal.

When the frequency of the VCO signal is 16 times the frequency of the reference signal, if the phase of the reference signal and the phase of the 1/16-frequency-divided signal once match with each other one time, the phases will subsequently always match. In this case, the resolution of the phase difference is one-half period of the VCO signal, whereby signals supplied from output terminals 13-17 are all either high level (1) or all low level (0).

When the frequency of the VCO signal is larger than 16 times the frequency of the reference signal, the state change of the 1/16-frequency-divided signal occurs earlier than the state change of the reference signal. In this case, the VCO signal repeats the operation of several periods in the time interval from the time that the state of the 1/16-frequency-divided signal changes until the latch operation is carried out. The state of each signal that is latched in each ½-frequency divider is determined according to this time interval. The signals that are supplied from output terminals 13-17 at this time indicate the phase differences between the reference signal and ⅙-frequency-divided signals and indicate the phase difference between the reference signal and the VCO signal.

The latch operation is the latching by latches 31-35 of a VCO signal or frequency-divided signal at the timing of the edge of the reference signal.

When the frequency of the VCO signal is smaller than 16 times the frequency of the reference signal, the state change of the 1/16-frequency-divided signal occurs later than the state change of the reference signal. In this case, the latch operation is carried out before the state of the 1/16-frequency-divided signal changes. The state of each signal that is latched in each ½-frequency divider is determined according to the time interval from the change of state of this 1/16-frequency-divided signal until the latch operation is carried out. The signals supplied from output terminals 13-17 at this time indicate the phase differences between the reference signal and the ⅙-frequency-divided signals and indicate the phase difference between the reference signal and the VCO signal.

Figure 8:
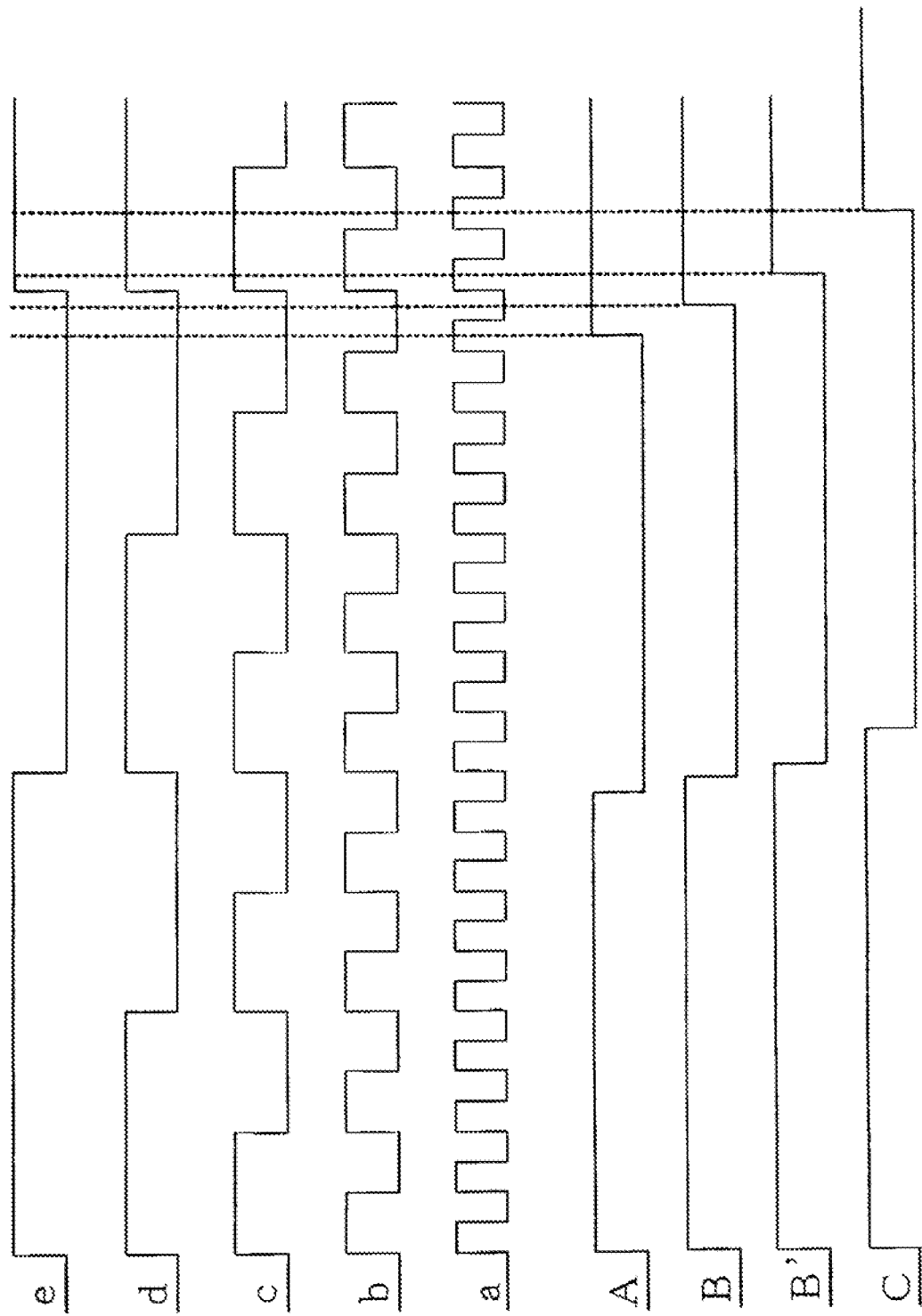
FIG. 8 is a timing chart for explaining the operation of the phase comparison circuit of the first embodiment of the present invention.

The operation of the phase comparator of the present embodiment is next described using FIG. 8. In FIG. 8, a-e correspond to output terminals a-e shown in FIG. 7 and represent the signals transmitted to these output terminals a-e, More specifically, a represents the VCO signal, b represents a ½-frequency-divided signal, c represents a ¼-frequency-divided signal, d represents a ⅛-frequency-divided signal, and e represents a 1/16-frequency-divided signal. In addition, ½-frequency dividers 21-24 are assumed to be components in which the states of the output signals change at the timing of the rising edge of the input signal. Still further, A and C represent reference signals having different frequencies than the 1/16-frequency-divided signal, and B and B' represent reference signals whose which frequency and phase match those of the 1/16-frequency-divided signal.

Because the phase comparator shown in FIG. 7 is incapable of detecting a phase difference of less than one-half period of the VCO signal, when the latch operation is carried out at the timing of the edge of reference signal B, the signals supplied from output terminals 13-17 are all low level, and when the latch operation is carried out at the timing of the edge of reference signal B', the signals supplied from output terminals 13-17 are all high level.

At this time, output terminals 13-17 supply phase difference signals in binary notation in which the latch result of the ⅟₁₆-frequency-divided signal is taken as the most significant bit and the latch result of the VCO signal is taken as the least significant bit.

Explanation next regards a case in which the latch operation is carried out at the timing of the edge of reference signal A.

In this case, from the time the latch operation is carried out until the states of all of ½-frequency-divided signal ⅟₁₆-frequency-divided signal have changed requires a time interval of slightly less than one-half period of the VCO signal. As a result, the phase of the ⅟₁₆-frequency-divided signal is delayed from the phase of the reference signal by slightly more than one-half period of the VCO signal. In this case, the phase difference signal in binary notation indicates "00001."

When the latch operation is carried out at a timing that is on the order of one-half period of the VCO signal earlier than the timing shown in FIG. 8, the phase difference signal indicates "00010." With implementation of the latch operation at timings that are progressively on the order of one-half period of the VCO signal earlier, the phase difference signals indicate "00011," "00100," "00101," and so on.

The following explanation regards a case in which the latch operation is carried out at the timing of the edge of reference signal C.

In this case, the VCO signal repeats state changes from the change of the states of all of ½-frequency-divided signal ⅟₁₆-frequency-divided signal until the latch operation is carried out. In addition, the state of the ½-frequency-divided signal also changes. Accordingly, the phase of the ⅟₁₆-frequency-divided signal is advanced by 1-1.5 period with respect to the phase of the reference signal. In this case, the phase difference signal indicates "11101."

When the latch operation is carried out at a timing that is advanced or delayed by one-half period from the timing shown in FIG. 8, the phase difference signal is "11110" or "11100." With implementation of the latch operation at timings that are progressively earlier by about one-half period of the VCO signal, the phase difference signals indicate "11011," "11010," "11001," and so on.

The effect is next described.

According to the present embodiment, a frequency divider frequency-divides in steps the VCO signal that is applied as input to input terminal 10 and supplies each VCO signal of each step. The latch unit performs latching of the VCO signal that was applied as input to input terminal 10 and each VCO signal that is supplied from the frequency divider based on a reference signal that is applied to input terminal 11. The output unit supplies the latching results realized by the latch unit as phase difference signals that indicate the phase differences of the reference signal and VCO signals.

In this case, phase difference can be detected even without using an inverter, and control of the VCO can be realized with high precision.

In addition, in the present embodiment, the frequency divider ½-frequency-divides the VCO signal in steps. In this case, the frequency divider can be easily produced.

Second Embodiment

Figure 9:
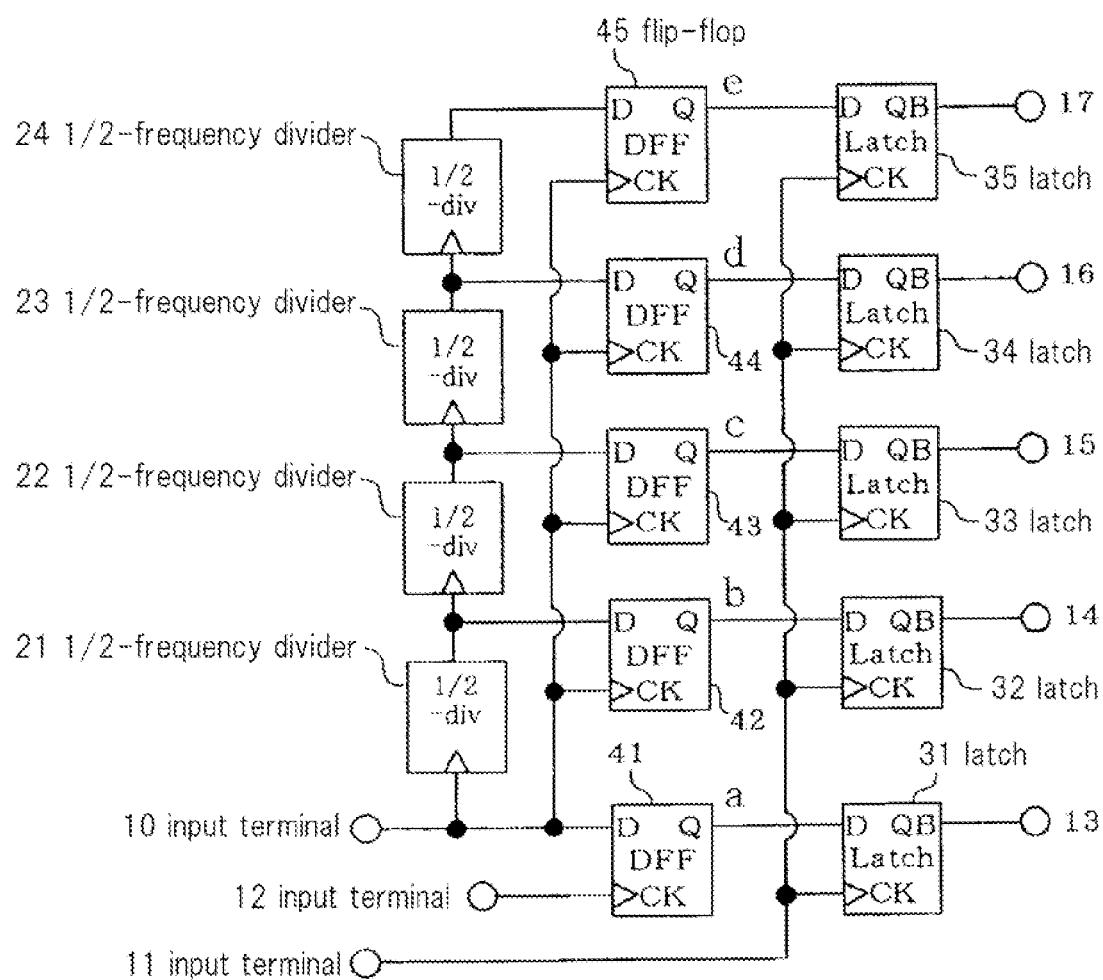
FIG. 9 is a block diagram showing the configuration of the phase comparison circuit of the second embodiment of the present invention.

FIG. 9 is a block diagram showing the phase comparator of the second embodiment of the present invention. In FIG. 9, the phase comparator further includes, in addition to the configuration shown in FIG. 7, input terminal 12 and a synchronization unit that includes delayed flip-flops 41-45.

In the phase comparator shown in FIG. 7, the VCO signal applied as input to input terminal 10 is frequency-divided in steps by frequency dividers 21-24. In addition, flip-flops are ordinarily used in frequency dividers 21-24. In the flip-flops used in frequency dividers 21-24, a delay time is generated from the clock input until data output. As a result, the frequency-divided signals are delayed with respect to the VCO signal. At this time, the frequency-divided signals that have undergone more instances of frequency division in the ½-frequency dividers are more greatly delayed, and the phase of the ⅟₁₆-frequency-divided signal of the final stage is the most greatly delayed from the phase of the VCO signal.

If the delay time of this ⅟₁₆-frequency-divided signal is equal to or less than the resolution (i.e., one-half period of the VCO signal), there is no problem if the phase comparator shown in FIG. 7 detects a phase difference between the reference signal and the VCO signal. However, when the delay time of the ⅟₁₆-frequency-divided signal is greater than one-half period of the VCO signal, error occurs in the phase difference that is greater than the resolution. In the present embodiment, this error is corrected by using a synchronization unit.

Typically, an enable state clock signal is applied as input to input terminal 12.

The synchronization unit synchronizes each of the VCO signals supplied from ½-frequency dividers 21-24 and the reference signal applied as input to input terminal 10.

More specifically, each of flip-flops 42-45 of the synchronization unit latches a respective frequency-divided signal supplied from ½-frequency dividers 21-24 based on the VCO signal applied as input to input terminal 10, whereby ½-frequency-divided signal-⅟₁₆-frequency-divided signal can be synchronized at the timing of the state change of the VCO signal. As a result, the delay time realized by ½-frequency division can be corrected.

Flip-flop 41 latches the VCO signal that is applied to input terminal 10 based on the clock signal that is applied to input terminal 12.

In addition, because an enable-state clock signal is always applied to flip-flop 41, the VCO signal passes by the same circuit as flip-flops 42-45 and the VCO signal is synchronized with ½-frequency-divided signal-⅟₁₆-frequency-divided signal.

Each of latches 31-35 latches a VCO signal or frequency-divided signal that was latched by each of flip-flops 41-45 based on the reference signal that was applied to input terminal 11.

Based on the foregoing, phase difference can be detected with greater accuracy.

A timing chart of the present embodiment is the same as the timing chart shown in FIG. 8. In the present embodiment, moreover, output terminals a-e shown in FIG. 7 correspond to the output terminals of flip-flops 41-45.

The effects are next described.

In the present embodiment, the synchronization unit synchronizes the VCO signal that was applied to input terminal 11 and each of the frequency-divided signals that were supplied from the frequency divider. The latch unit latches the VCO signal and each of the frequency-divided signals that were synchronized in the synchronization unit based on the reference signal.

In this case, a more accurate phase difference can be detected because the delay of the frequency-divided signals can be corrected. Accordingly, control of a VCO can be carried out with higher precision.

In the present embodiment, moreover, the synchronization unit includes flip-flops 41-45. Flip-flops 42-45 latch each of the frequency-divided signals supplied from the frequency divider based on the VCO signal that is applied as input to input terminal 10. Flip-flop 41 latches the VCO signal applied as input to input terminal 10 based on a signal that is always in the enable state and that is applied to input terminal 11.

In this case, the synchronization unit can be easily produced.

Third Embodiment

Figure 10:
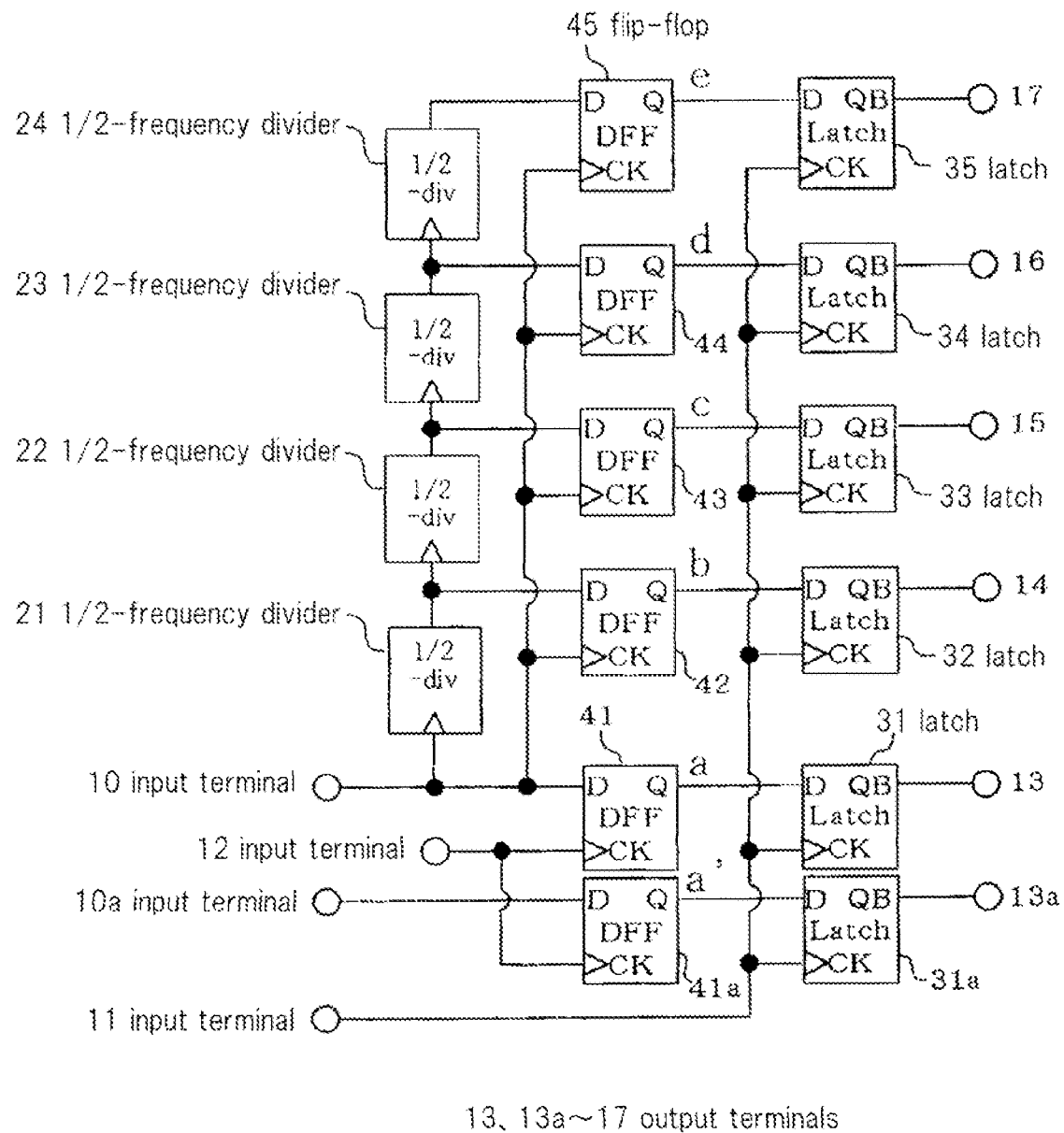
FIG. 10 is a block diagram showing the configuration of the phase comparison circuit of the third embodiment of the present invention.

FIG. 10 is a block diagram showing the configuration of the phase comparator of the third embodiment of the present invention. In FIG. 10, the phase comparator further includes input terminal 10a, latch 31a, and flip-flop 41a in addition to the configuration shown in FIG. 9.

Input terminal 10a is an example of a different-phase input terminal. A 90-degree-difference phase signal having a phase that differs by 90 degrees from the VCO signal is applied to input terminal 10a. The 90-degree-difference phase signal is in some cases generated in a four-phase output VCO, and in some cases is generated by oscillating a VCO signal at a frequency of two or more times the desired frequency and then frequency-dividing this oscillated signal.

Flip-flop 41a latches the 90-degree-difference phase signal that was applied as input to input terminal 10a based on the clock signal that was applied to input terminal 12, whereby the 90-degree-difference phase signal can pass through the same circuit as flip-flops 42-45, and the 90-degree-difference phase signal is synchronized with ½-frequency-divided signal-1/16-frequency-divided signal.

Latch 31a is an example of a different-phase latch means. Latch 31a latches the 90-degree-difference phase signal that was latched in flip-flop 41a based on the reference signal that was applied to input terminal 11. Latch 31a applies the latch result to output terminal 13a.

Output terminal 13a supplies the latch result that was applied from latch 31a. Output terminal 13a is included in the output unit, and as a result, the latch result supplied from output terminal 13a is a portion of the phase difference signal.

The principles for detecting phase difference are the same as explained in the second embodiment, but because a signal having a phase that differs by 90 degrees from the VCO signal is further employed according to the present embodiment, the resolution of phase difference is improved to one-fourth period of the VCO signal.

Figure 11:
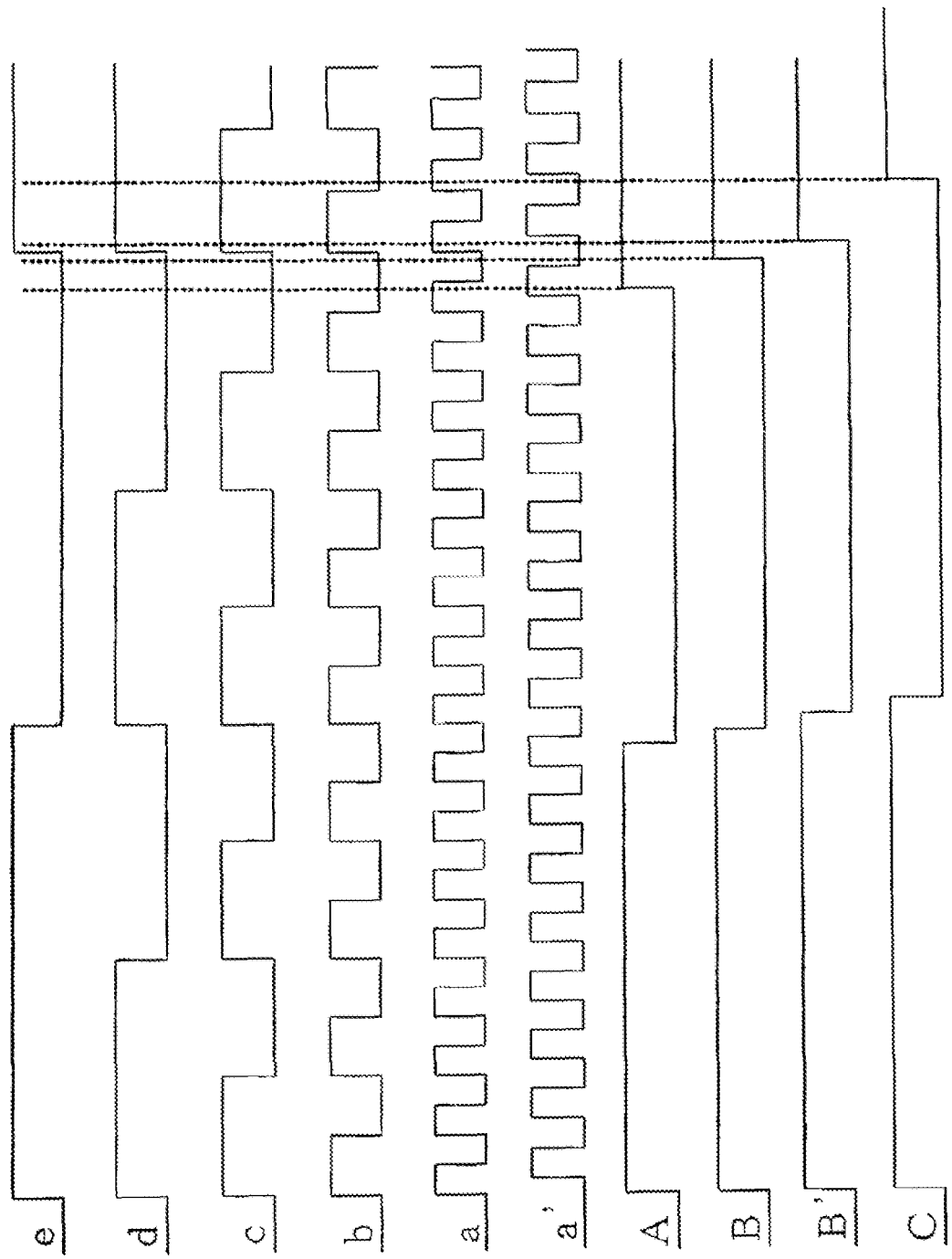
FIG. 11 is a timing chart for explaining the operation of the phase comparison circuit of the third embodiment of the present invention.

The operation of the phase comparator of the present embodiment is next described using FIG. 11. ½-frequency dividers 21-24 are assumed to be components in which the states of output signals change at the timing of the rising edge of the input signal. In addition, the signal delay caused by ½-frequency dividers 21-24 and flip-flops 41a and 41-45 is ignored. This feature is similar to the next fourth embodiment.

In FIG. 11, a' and a-e correspond to output terminals a' and a-e of flip-flops 41a and 41-45 in FIG. 10 and represent the signals that are transmitted by these output terminals a' and a-e. More specifically, a represents the VCO signal, and a' represents the 90-degree-difference phase signal. In addition, b-e represent ½-frequency-divided signal-1/16-frequency-divided signal.

As in FIG. 8, A and C represent reference signals having frequency that differs from 1/16-frequency-divided signal, and B and B' represent reference signals whose frequency and phase match the 1/16-frequency-divided signal. This point also holds true for the next fourth embodiment.

The phase comparator shown in FIG. 10 uses a 90-degree-difference phase signal and therefore improves the resolution of phase difference, but is nevertheless incapable of detecting a phase difference of less than one-fourth the period of the VCO signal. As a result, when a latch operation is carried out at the timing of the edge of reference signal B, the phase difference signals supplied from output terminals 13a and 13-17 are all low level, and when the latch operation is carried out at the timing of the edge of reference signal B', the latch result of the 90-degree difference phase signal a' is low level and the rest are all high level. At this time, output terminals 13-17 supply phase difference signals in binary notation in which the latch result of the 1/16-frequency-divided signal is taken as the most significant bit and the latch result of the VCO signal is taken as the least significant bit.

A latch operation at the timing of the edge of reference signal A is next described.

In this case, a time interval of from one-half to less than three-fourths of the period of the VCO signal is necessary from the time the latch operation is carried out until the change of all states of the ½-frequency-divided signal-1/16-frequency-divided signal. As a result, the phase of the 1/16-frequency-divided signal is delayed from the phase of the reference signal by more than one-half the period of the VCO signal but less than three-fourths the period of the VCO signal. In this case, the phase difference signal in binary notation is "000011." However, because the two lower-order bits of the phase difference signal are values at the same frequency, establishing a difference between the two by weighting is inappropriate, and these values must be treated as a thermometer code, as will be explained hereinbelow.

The latch operation at the timing of the edge of reference signal C is next described.

In this case, the state change of the VCO signal is repeated from the change of the states of all of ½-frequency-divided signal-1/16-frequency-divided signal until the latch operation is carried out. In addition, the state of the ½-frequency-divided signal also changes. Based on the latch result of the 90-degree-difference phase signal, it can be seen that the phase of the 1/16-frequency-divided signal has advanced with respect to the phase of reference signal C by greater than one period of the VCO signal but less than 1.25 period of the VCO signal. In this case, the phase difference signal in binary notation is "111010." The advance or delay of the phase between the 1/16-frequency-divided signal and reference signal C can be determined by the most significant bit of the phase difference signal. In addition, the two lower-order bits of the phase difference signal must be treated as thermometer code as in the case of reference signal A.

The effects are next described.

In the present embodiment, a 90-degree-difference phase signal that is of the same frequency as the VCO signal and that has a different phase than the VCO signal is applied as input to input terminal 11. Latch 31a latches the different-phase signal that is applied as input to input terminal 11 based on the reference signal. The output unit supplies the result of latching by the latch unit and the result of latching by latch 31a as a phase difference signal.

In this case, control of the VCO can be realized with higher precision without increasing the number of ½-frequency dividers.

Fourth Embodiment

Figure 12:
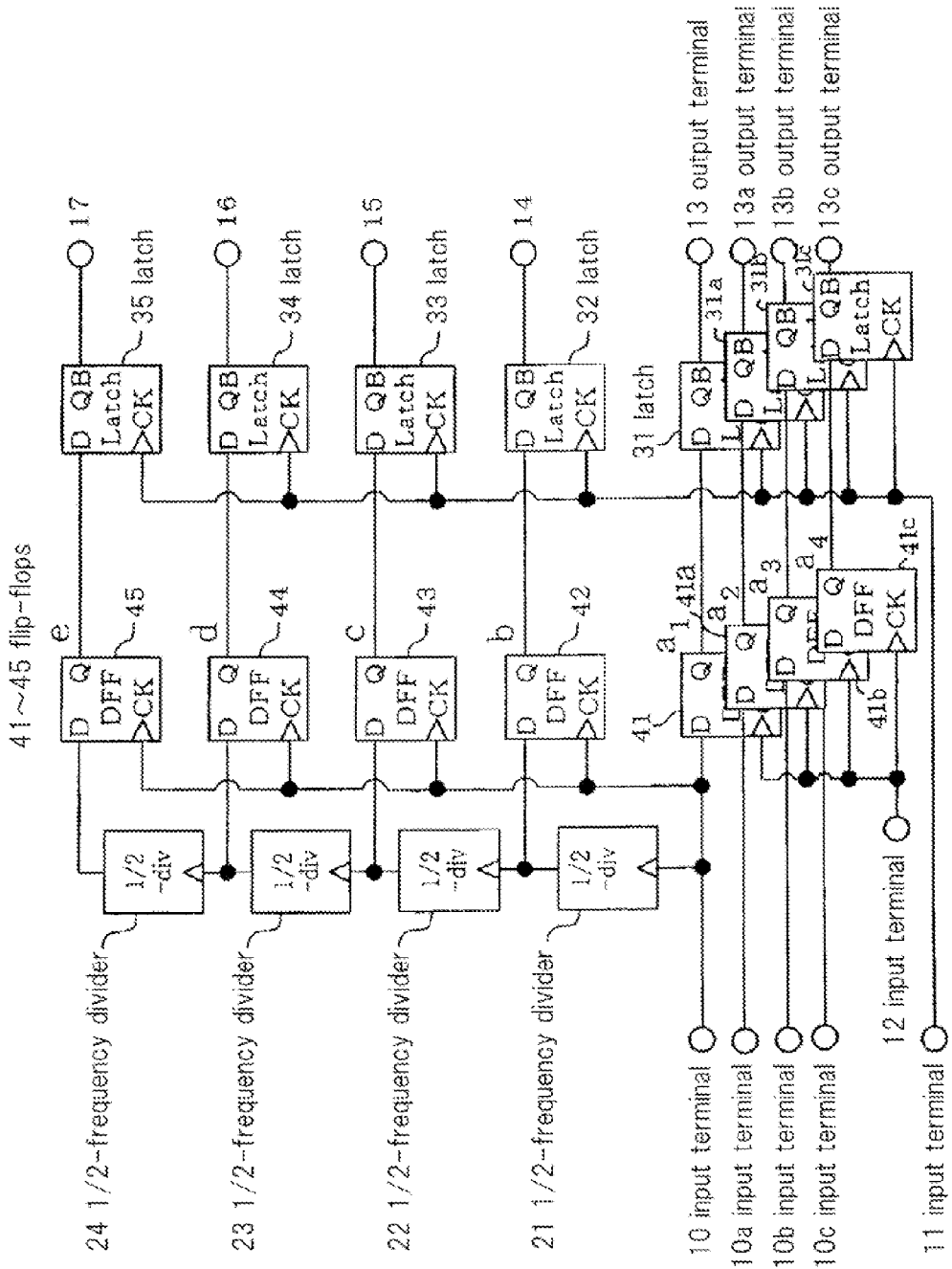
FIG. 12 is a block diagram showing the configuration of the phase comparison circuit of the fourth embodiment of the present invention.

FIG. 12 is a block diagram showing an embodiment of the phase comparator of the fourth embodiment of the present invention. In FIG. 12, the phase comparator further includes input terminals 10b and 10c, flip-flops 41b and 41c, and latches 31b and 31c in addition to the configuration shown in FIG. 10.

In the present embodiment, 45-degree-difference phase signal having a phase that differs from the VCO signal by 45 degrees is applied as input to input terminal 10a, a 90-degree-difference phase signal is applied as input to input terminal 10b, and a 135-degree-difference phase signal having phase that differs by 135 degrees from the VCO signal is applied as input to input terminal 10c. The 45-degree-difference phase signal, the 90-degree-difference phase signal, and the 135- degree-difference phase signal are hereinbelow sometimes all referred to as different-phase signals. In addition, input terminals 10a-10c are a different-phase input unit that is one example of the different-phase input means.

The different-phase signals are in some cases generated in an eight-phase output VCO, and in some cases generated by oscillating a VCO signal at a frequency more than four times the desired frequency and then frequency-dividing this oscillated signal.

Flip-flop 41a latches the 45-degree-difference phase signal that was applied to input terminal 10a based on the clock signal applied to input terminal 12. Flip-flop 41b latches the 90-degree-difference phase signal that was applied to input terminal 10b based on the clock signal applied to input terminal 12. Flip-flop 41c latches the 135-degree-difference phase signal applied to input terminal 10c based on the clock signal applied to input terminal 12.

In this way, the different-phase signals can pass through the same circuit as flip-flops 42-45, and the different-phase signals are synchronized together with ½-frequency-divided signal-$\frac{1}{16}$-frequency-divided signal.

Latch 31a latches the 45-degree-difference phase signal that was latched in flip-flop 41a based on the reference signal that was applied to input terminal 11. Latch 31b latches the 90-degree-difference phase signal that was latched in flip-flop 41b based on the reference signal applied to input terminal 11. Latch 31c latches the 135-degree-difference phase signal that was latched in flip-flop 41c based on the reference signal that was applied to input terminal 11.

Latches 31a-31c each apply the latch result realized by that latch to output terminals 13a-13c, respectively.

Latches 31a-31c are the different-phase latch unit that is one example of the different-phase latch means.

Each of output terminals 13a-13c supplies the respective latch result that was received as input from latches 31a-31c, respectively. In addition, output terminals 13a-13c are included in the output unit.

The principles for detecting phase difference are the same as described in the second embodiment, but due to the further use of a plurality of signals having phases that differ by 45 degrees, 90 degrees, and 135 degrees from the VCO signal, the present embodiment improves the resolution of phase difference to one-eighth period of the VCO signal.

Figure 13:
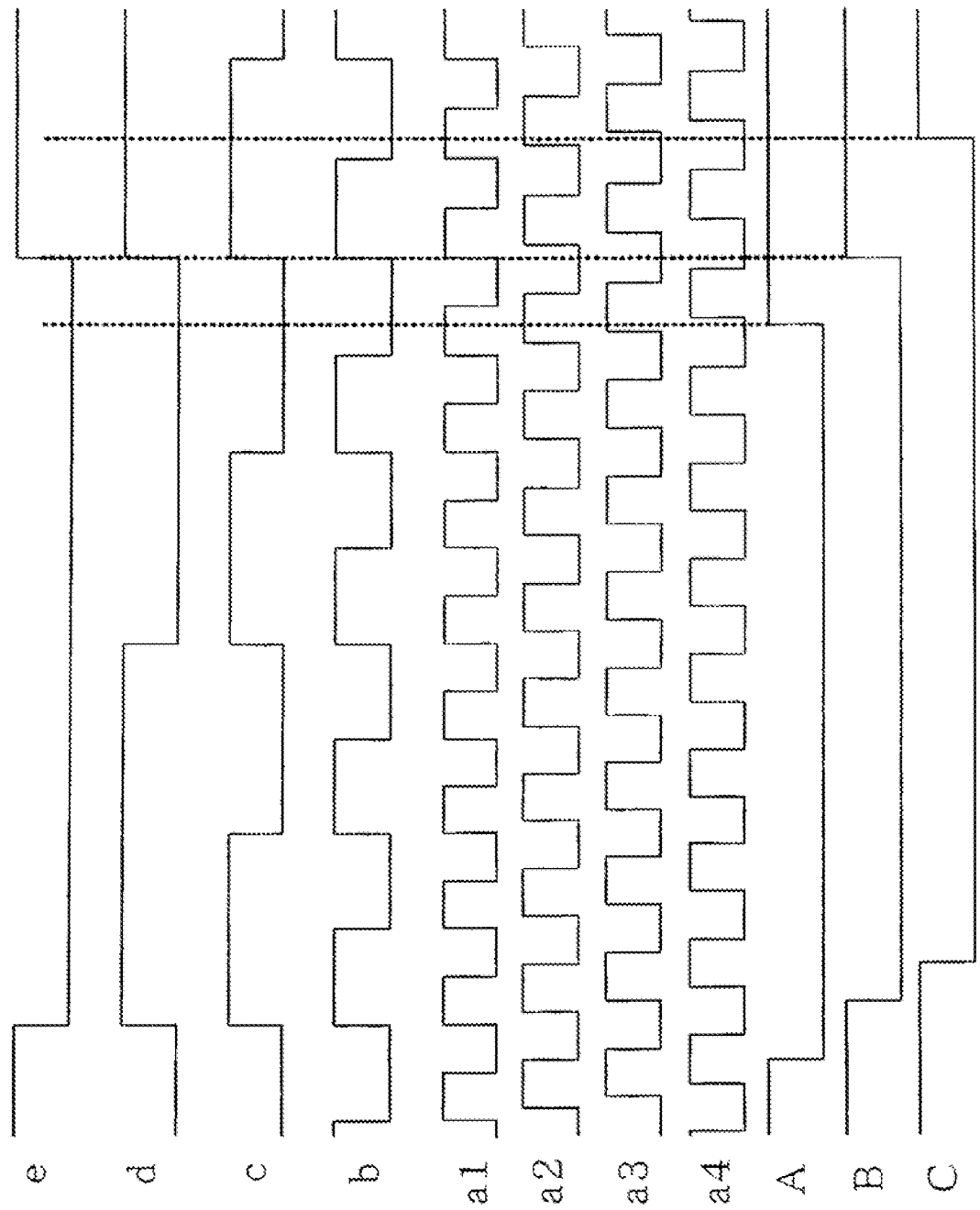
FIG. 13 is a timing chart for explaining the operation of the phase comparison circuit of the fourth embodiment of the present invention.

The operation of the phase comparator of the present embodiment is next described using FIG. 13.

In FIG. 13, a1-a4 and b-e correspond to output terminals a1-a4 and b-e of flip-flops 41-41c and 42-45 in FIG. 12 and represent the signals transmitted from these output terminals a1-a4 and b-e. More specifically, a1 represents the VCO signal, a2-a4 represent the 45-degree-difference phase signal-135-degree-difference phase signal, and b-e represent the ½-frequency-divided signal-$\frac{1}{16}$-frequency-divided signal.

Through the use of the 45-degree-difference phase signal-135-degree-difference phase signal, the phase comparator shown in FIG. 12 obtains an improvement of the resolution of the phase difference, but is still unable to detect a phase difference of less than one-eighth of the period of the VCO signal. As a result, the phase difference signals supplied from output terminals 13a-13c and 13-17 are all low level when the latch operation is carried out at the timing of the edge of reference signal B. At this time, phase difference signals in binary notation are supplied by treating the latch result of the $\frac{1}{16}$-frequency-divided signal as the most significant bit and the latch result of the VCO signal as the least significant bit.

The latch operation at the timing of the edge of reference signal A is next described.

In this case, a time interval of at least a five-eighths period and less than three-quarters period of the VCO signal is required from the implementation of the latch operation until the states of all of ½-frequency-divided signal-$\frac{1}{16}$-frequency-divided signal change. Accordingly, the phase of the $\frac{1}{16}$-frequency-divided signal is later than the phase of the reference signal by at least five-eighths of the period but less than three-quarters of the period of the VCO signal.

At this time, the latch results of the different-phase signals must be considered as thermometer code. This is because the time difference (phase difference) that is detected in the different-phase signals is merely shifted by a fixed time and weighting of the time difference is not possible. Accordingly, these phase difference signals are the synthesis of binary code "0000" of the frequency divider and thermometer code "1110."

Explanation next regards a case in which latch operation is carried out at the timing of the edge of reference signal C.

In this case, a state change of the VCO signal is repeated from the change of states of all of ½-frequency-divided signals—$\frac{1}{16}$-frequency-divided signals until the latch operation is carried out. In addition, the state of ½-frequency-divided signal also changes. It can be seen from the latch results of the 45-degree-difference phase signal, the 90-degree-difference phase signal, and the 135-degree-difference phase signal that the phase of the $\frac{1}{16}$-frequency-divided signal is advanced from the phase of reference signal C by at least a 1.125 period and less than a 1.25 period of the VCO signal. In this case, the phase difference signal is the synthesis of the binary code "1110" and the thermometer code "1100." This can be determined by the most significant bit of the phase difference signal. The advance or delay of the phase between the $\frac{1}{16}$-frequency-divided signal and reference signal C can be determined by the most significant bit of the phase difference signal. In the present embodiment, there is a plurality of different-phase signals, and the phases of these different-phase signals differ from each other, whereby control of the VCO can be carried out with higher accuracy.

Fifth Embodiment

Figure 14:
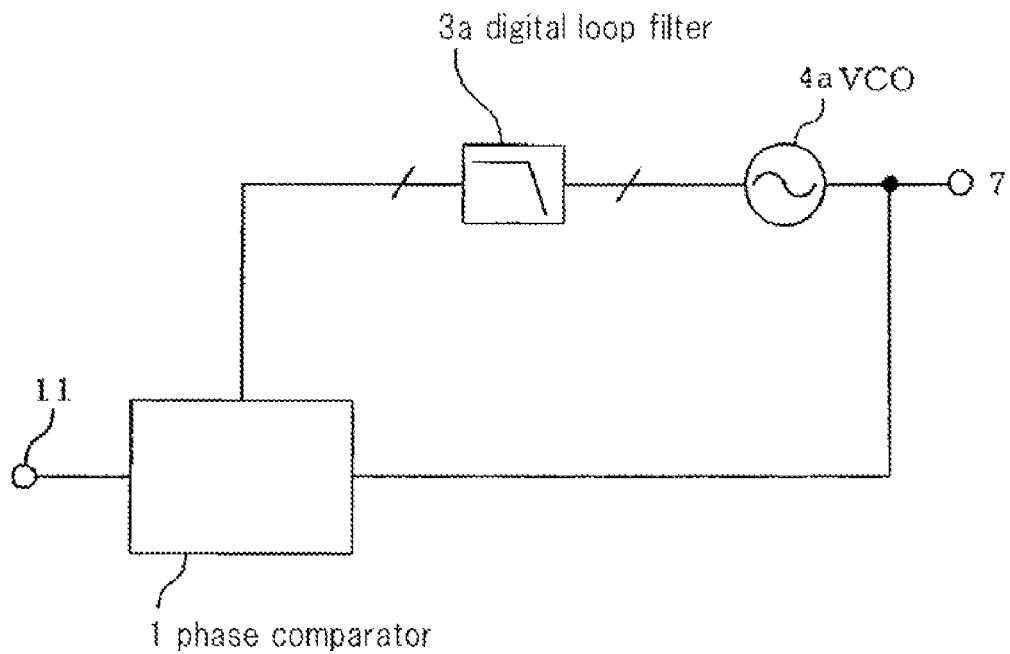
FIG. 14 is a block diagram showing the configuration of the PLL of the fifth embodiment of the present invention.

FIG. 14 is a block diagram showing the configuration of the PLL of the fifth embodiment of the present invention. In FIG. 14, the PLL includes phase comparator 1, digital loop filter 3a, VCO 4a, and output terminal 7.

As phase comparator 1, any one of the phase comparators shown in the first to fourth embodiments is used. A reference signal from outside the PLL circuit is applied to input terminal 11 of phase comparator 1.

Digital loop filter 3a smoothes the phase difference signal that is supplied from phase comparator 1 and applies the smoothed phase difference signal to VCO 4a.

VCO 4a is an example of an oscillator. VCO 4a is controlled by the phase difference signal that is applied as input from digital loop filter 3a. More specifically, VCO 4a oscillates at a frequency that accords with the phase difference signal and applies a signal of the oscillated frequency as the VCO signal to phase comparator 1 and output terminal 7. At this time, VCO 4a receives the VCO signal as a reference signal at input terminal 10 of phase comparator 1.

In the varactor group in VCO 4a, a number of varactors sufficient for correcting the phase differences detected in phase comparator 1 are connected together in parallel.

The effects are next described.

The PLL of the present embodiment employs the phase comparator shown in the first to fourth embodiments, whereby a PLL can be provided that enables the control of VCO with high precision.

Sixth Embodiment

Figure 15:
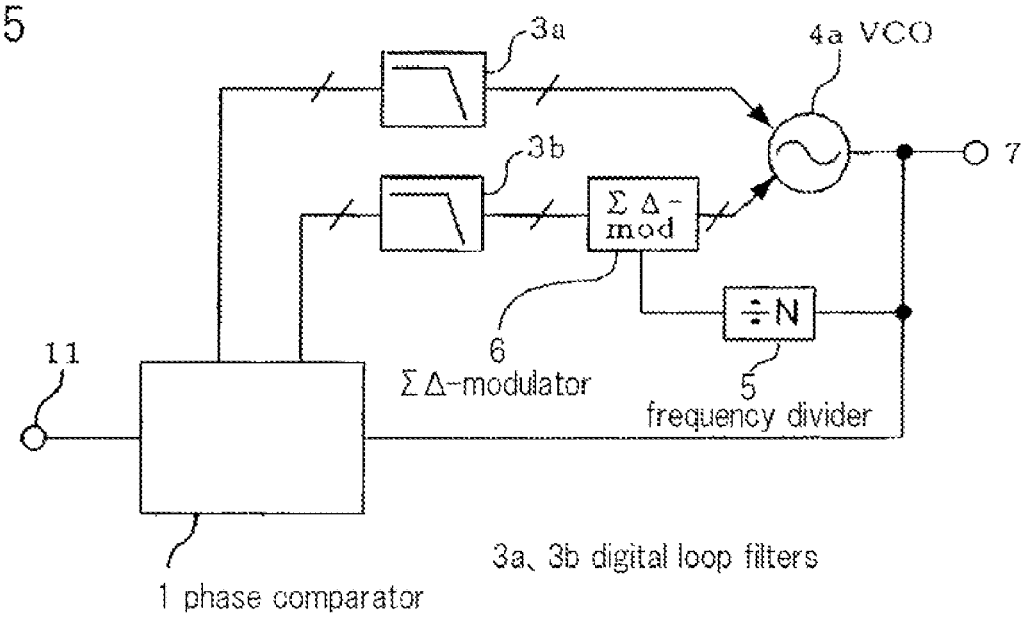
FIG. 15 is a block diagram showing the configuration of the PLL of the sixth embodiment of the present invention.

FIG. 15 is a block diagram showing the configuration of the PLL of the sixth embodiment of the present invention. In FIG. 15, the PLL includes digital loop filter 3b, frequency divider 5, and ΣΔ-modulator 6 in addition to the configuration shown in FIG. 14.

Digital loop filter 3b smoothes a portion of the phase difference signal that is supplied from phase comparator 1.

More specifically, digital loop filter 3b smoothes the lower-order bits of the phase difference signal that is supplied from phase comparator 1. In addition, digital loop filter 3a smoothes the higher-order bits of the phase difference signal that is supplied from phase comparator 1. Here, higher-order bits include at least the most significant bit, and lower-order bits include at least the least significant bit. Bits that fall below the most significant bit and that rank higher than the least significant bit may be treated as higher order bits and may be treated as lower order bits.

Digital loop filter 3a applies the higher-order bits of the smoothed phase difference signal as input to VCO 4a.

Digital loop filter 3b applies the lower-order bits of the smoothed phase difference signal as input to ΣΔ-modulator 6.

Frequency divider 5 1/N-frequency-divides the VCO signal that was supplied from VCO 4a and applies the frequency-divided VCO signal as input to τΔ-modulator 6. N is a positive integer.

τΔ-modulator 6 carries out τΔ-modulation (sigma-delta modulation) of the lower-order bits of the phase difference signal that was received from digital loop filter 3b and applies the τΔ-modulated signal, which is the lower-order bits that have undergone τΔ-modulation, as input to VCO 4a. τΔmodulator 6 further suppresses the error of ΣΔ modulation based on the VCO signal that is received from frequency divider 5.

VCO 4a oscillates at a frequency that accords with the higher-order bits that are received from digital loop filter 3a. At this time, VCO 4a changes the capacitance of the varactors in VCO 4a according to the ΣΔ-modulated signal from ΣΔ modulator 6 and thus adjusts the oscillated frequency. In this way, a greater reduction of noise of the VCO signal can be achieved than by the PLL shown in FIG. 14.

The effects are next explained.

In the present embodiment, τΔ-modulator 6 performs ΣΔ-modulation of a portion of the phase difference signal that is supplied from phase comparator 1. VCO 4a adjusts the frequency of the VCO signal according to the phase difference signal that has undergone ΣΔ-modulation in ΣΔ modulator 6.

In this case, a reduction of the noise of the VCO signal can be achieved.

Seventh Embodiment

Figure 16:
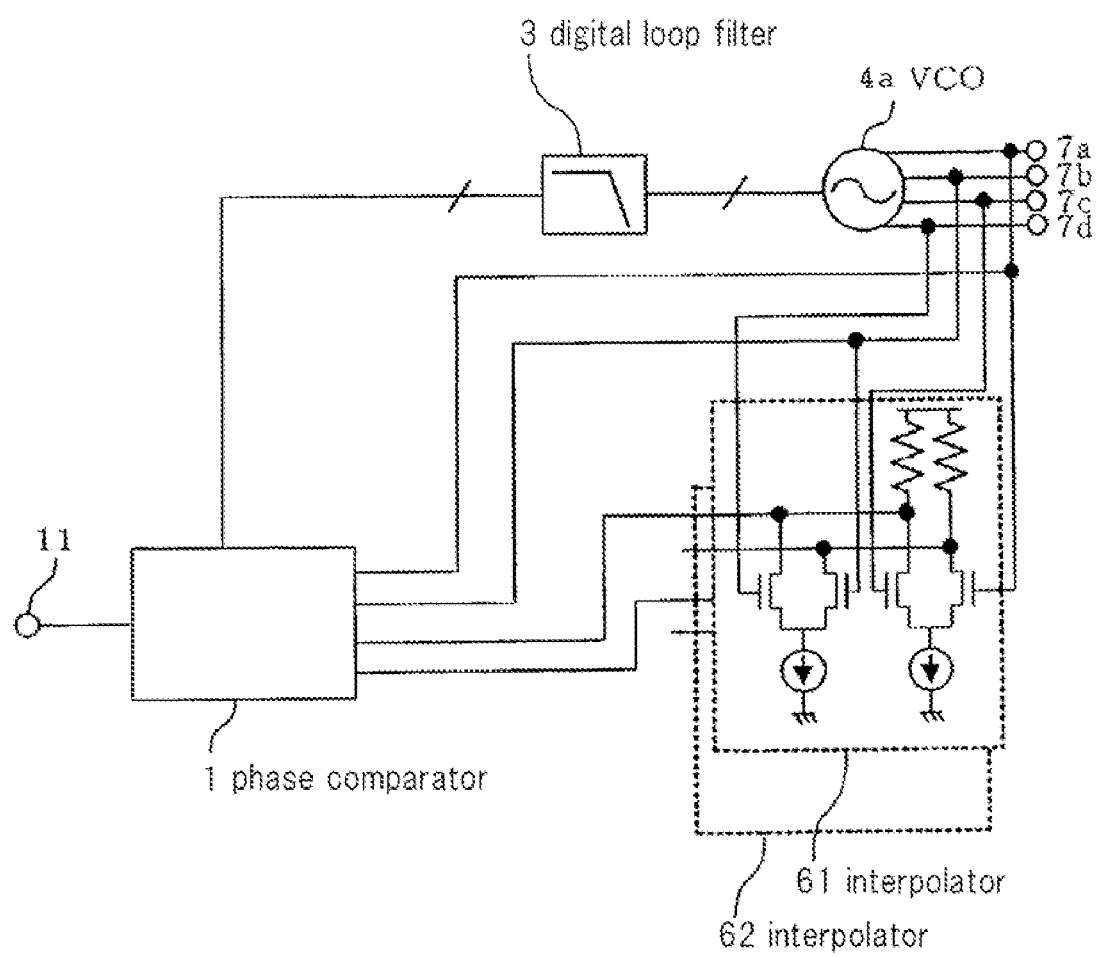
FIG. 16 is a block diagram showing the configuration of a PLL of the seventh embodiment of the present invention.

FIG. 16 is a block diagram showing the configuration of the PLL of the seventh embodiment of the present invention.

In FIG. 16, the PLL includes a generator having interpolators 61 and 62 in addition to the configuration shown in FIG. 14. The PLL further includes output terminals 7a-7d in place of output terminal 7.

VCO 4a oscillates at a frequency that accords with the phase difference signal that is applied as input from digital loop filter 3a, and generates four VCO signals having this frequency and having mutual phase differences of 90 degrees. VCO 4a supplies each of the four VCO signals from respective output terminals 7a-7d. In the following explanation, VCO signals having phases shifted 90 degrees, 180 degrees, and 270 degrees with respect to the VCO signal applied as input to output terminal 7a are supplied to output terminals 7b-7d, respectively.

VCO 4a applies the VCO signal that is supplied to output terminal 7a to phase comparator 1, and applies the VCO signal that is supplied to output terminal 7b to phase comparator 1 as the 90-degree-difference phase signal.

Output terminals 7a-7d supply the VCO signals that were applied from VCO 4a.

A generator generates VCO signals, the 45-degree-difference phase signal, and the 135-degree-difference phase signal for application to phase comparator 1 from the four VCO signals supplied from VCO 4a.

More specifically, each of interpolators 61 and 62 includes two differential circuits that a share load. VCO signals that are the same as the VCO signals applied to each of output terminals 7a and 7b are applied to one of the differential circuits, and VCO signals that are the same as VCO signals applied to each of output terminals 7c and 7d are applied to the other differential circuit. Setting each of the current ratios of the two differential circuits to one-to-one and one-to-negative one enables generation of the 45-degree-difference phase signal and 90-degree-difference phase signal.

Interpolators 61 and 62 apply the generated 45-degree-difference phase signal and 90-degree-difference phase signal to phase comparator 1.

The effects are next described.

VCO 4a generates a plurality of VCO signals having phase differences with each other according to the phase difference signals supplied from phase comparator 1 and supplies these VCO signals as output. In addition, VCO 4a applies any one of this plurality of VCO signals as input to phase comparator 1. The generator generates different-phase signals based on the plurality of VCO signals that are supplied from VCO 4a and applies these different-phase signals to phase comparator 1.

In this case, different-phase signals are applied as input to phase comparator 1. A more accurate phase difference can be detected.

In the present embodiment, moreover, the generator is formed by two differential circuits that share a load.

In this case, the generator can be easily produced.

Although preferable embodiments have been described hereinabove, the present invention is not limited to these embodiments and is open to suitable modifications within a scope that does not depart from the gist of the present invention. For example, although a ½-frequency divider was used as the frequency division means in the present embodiments, a ⅓-frequency divider or ¼-frequency divider may also be used as the frequency division means. In addition, the number of ½-frequency dividers was four, but in actuality, the number may be one or more. Still further, although the third and fourth embodiments added new elements to the second embodiment, these elements may also be added to the first embodiment. Essentially, a plurality of VCO signals having mutually different phases may be used even when flip-flops are not used for synchronizing the frequency-divided signals.

This application is the National Phase of PCT/JP2008/065754, filed Sep. 2, 2008, which claims priority based on Japanese Patent Application 2007-238621 for which application was submitted on Sep. 14, 2007 and incorporates all of the disclosures of that application.

What is claimed is:
1. A phase comparator comprising:
a first input unit to which an object signal is applied;
a second input unit to which a reference signal is applied;
a frequency division unit that comprises a plurality of series-coupled frequency dividers that frequency-divides in steps the object signal received in said first input unit and supplies outputs of the frequency dividers as corresponding object signals of each step;

a latch unit that based on the reference signal that was applied to said second input unit, latches each of the object signals applied to said first input unit and each of the object signals that are supplied from said frequency division unit; and an output unit that supplies latch results realized by said latch unit as phase difference signals indicating phase differences of said reference signal and said object signals.

2. The phase comparator as set forth in claim 1, further comprising:

a synchronization unit that synchronizes the object signal that is applied to said first input unit and each of the object signals that are supplied from said frequency division unit;

wherein said latch latches each object signal that was synchronized in said synchronization unit based on said reference signal.

3. The phase comparator as set forth in claim 2, further comprising:

a third input unit to which a signal that is always in an enable state is applied as input;

wherein said synchronization unit includes:

a plurality of flip-flops that latches each of the object signals supplied from said frequency division unit based on the object signal applied as input to said first input unit; and a flip-flop that latches the object signal applied as input to said first input unit based on the signal that is always in an enable state applied as input to said third input unit.

4. The phase comparator as set forth in claim 1, wherein said frequency division unit ½-frequency-divides said object signal in steps.

5. The phase comparator as set forth in claim 1, comprising:

a different-phase input unit to which is applied as input one or a plurality of different-phase signals having the same frequency as said object signal and having phases that are different from said object signal; and different-phase latch unit that latching different-phase signals applied to said different-phase input unit based on said reference signal;

wherein said output unit supplies the latch result realized by said latch unit and the latch result realized by said different-phase latch unit as said phase difference signals.

6. The phase comparator as set forth in claim 5, wherein said output unit supplies the object signal that was applied as input to said first input unit and that was latched in said latch unit and different-phase signals that were latched in said different-phase latch unit as thermometer code.

7. A phase-locked loop comprising:

the phase comparator as set forth in claim 5;

an oscillator that generates a plurality of frequency signals having phase differences with each other according to phase difference signals that are supplied from said phase comparator and that supplies the plurality of frequency signals; and a generator that generates said different-phase signals based on a plurality of frequency signals supplied from said oscillator and that applies said different-phase signals to said phase comparator.

8. The phase-locked loop as set forth in claim 7, wherein said generator is formed by two differential circuits that share a load.

9. The phase comparator as set forth in claim 1, wherein said output unit supplies said phase difference signal in binary notation in which the object signal of the final step supplied from said frequency division unit and latched in said latch unit is taken as the most significant bit and the object signal applied to said second input unit and latched in said latch unit is taken as the least significant bit.

10. The phase comparator as set forth in claim 1, wherein said output unit supplies the object signal of the last step that is supplied from said frequency division unit and that was latched in said latch unit as a code that represents an advance or a delay of the phase of said reference signal and the phase of said object signal.

11. A phase-locked loop comprising:

the phase comparator as set forth in claim 1; and an oscillator that is controlled by the phase difference signals supplied from said phase comparator.

12. The phase-locked loop as set forth in any one of claim 11, further comprising:

a $\Sigma\Delta$-modulator that carries out $\Sigma\Delta$-modulation of a portion of the phase difference signals supplied from said phase comparator;

wherein said oscillator adjusts said frequency according to phase difference signals that have undergone $\Sigma\Delta$-modulation in said $\Sigma\Delta$-modulator.

13. A phase comparator comprising:

a first input unit to which an object signal is applied;

a second input unit to which a reference signal is applied;

a frequency division unit which includes a first frequency divider that frequency-divides the object signal received in the first input unit and supplies a first signal, and a second frequency division unit that frequency-divides a signal frequency-divided by the first frequency divider and supplies a second signal;

a latch unit that, based on the reference signal that was applied to the second input unit, latches the first signal and the second signal; and an output unit that supplies latch results realized by the latch unit as phase difference signals indicating phase differences of the reference signal and the object signals.

* * * * *